(12) United States Patent
Devulapalli et al.

(10) Patent No.: US 8,130,580 B1
(45) Date of Patent: Mar. 6, 2012

(54) LOW POWER SENSE AMPLIFIER FOR READING MEMORY

(75) Inventors: Sridhar Devulapalli, Colorado Springs, CO (US); Albert S. Weiner, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/876,064

(22) Filed: Sep. 3, 2010

(51) Int. Cl.
*G11C 7/02* (2006.01)

(52) U.S. Cl. .............. 365/207; 365/205; 365/189.05; 365/185.25

(58) Field of Classification Search .......... 365/207, 365/205, 189.05, 185.25, 203
See application file for complete search history.

(56) References Cited

U.S. PATENT DOCUMENTS

| | | | | |
|---|---|---|---|---|
| 5,696,719 | A * | 12/1997 | Baek et al. ............. | 365/189.05 |
| 6,836,426 | B1 * | 12/2004 | Fukushi et al. .............. | 365/205 |
| 7,333,386 | B2 * | 2/2008 | Bardouillet et al. .......... | 365/207 |
| 2010/0039851 | A1 * | 2/2010 | Morita et al. ............... | 365/207 |

* cited by examiner

*Primary Examiner* — Huan Hoang
(74) *Attorney, Agent, or Firm* — Fish & Richardson P.C.

(57) ABSTRACT

A low power sense amplifier is configured to sense the state of a memory cell (e.g., non-volatile memory cell) without the use of a reference current or direct current.

12 Claims, 3 Drawing Sheets

LOW POWER SENSE AMPLIFIER FOR READING MEMORY

TECHNICAL FIELD

This subject matter is generally related to electronics, and more particularly to low power sense amplifiers for reading memory.

BACKGROUND

Low power devices like Radio Frequency Identification (RFID) tags need low read currents in their embedded non-volatile memory (NVM) to maximize reading distance from an RFID transmitter. One known approach to sensing the state of a NVM cell is to set up read conditions on the memory cell and compare a cell current to a reference current that is generated in a sense amplifier. There are several known circuit designs to produce the reference current. A drawback of these designs, however, is that direct current is consumed by each sense amplifier. The direct current consumption can be in the order of 10s of microamperes to 100s of microamperes per sense amplifier depending on the read speed desired. The direct current consumed is multiplied by the number of sense amplifiers in the circuit. This total current adversely affects the read range of the RFID tag. The direct current can be reduced somewhat by slowing the sense amplifier, but it cannot be reduced beyond a certain point because there is a maximum read time allowed in the system.

SUMMARY

A low power sense amplifier is configured to sense the state of a memory cell (e.g., non-volatile memory cell) without the use of a reference current or direct current.

The low power sense amplifier may include one or more of the following advantages: 1) reducing the average and instantaneous power requirements of the low power sense amplifier to approximately 1 microampere per sense amplifier or less, when operated at 500 KHz; 2) eliminating the need for a reference current; and 3) eliminating the need for direct current (dc) consumed in the low power sense amplifier when reading or not reading memory.

DETAILED DESCRIPTION

Exemplary Circuit Design

Figure 1:
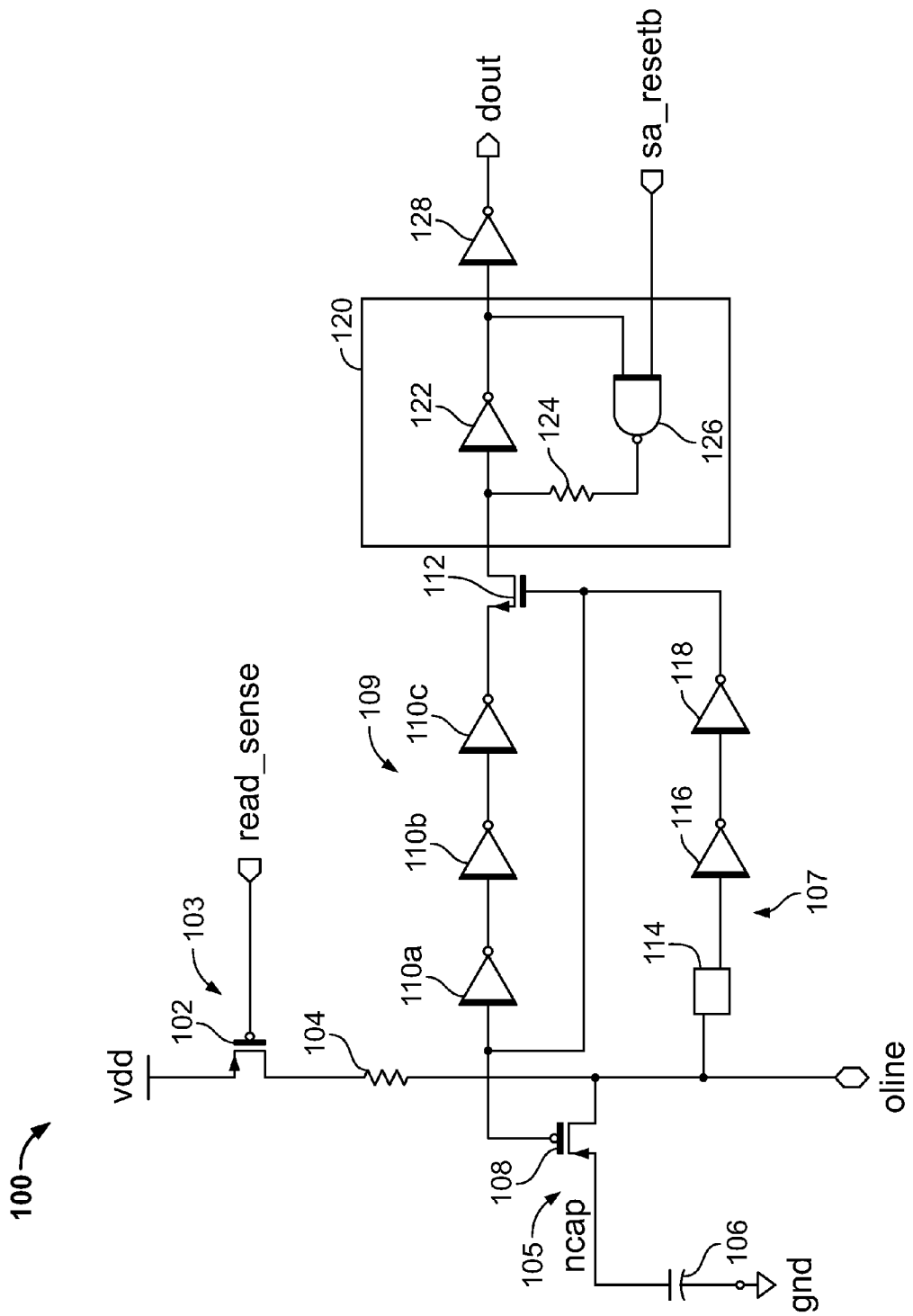
FIG. 1 is a schematic diagram of a low power sense amplifier.

FIG. 1 is a schematic diagram of a low power sense amplifier 100. In some implementations, the power sense amplifier 100 can include pre-charge circuit 103, sense capacitor circuit 105, voltage detection circuit 107, delay path 109 and output latch circuit 120.

Pre-charge circuit 103 can include transistor 102 (e.g., a p-channel transistor) and optionally current limiting resistor 104. The gate terminal of transistor 102 is coupled to a read sense input (read_sense). The source terminal of transistor 102 is coupled to a reference voltage (vdd), and the drain terminal of transistor 102 is coupled to resistor 104. Alternatively, resistor 104 can be omitted and the drain terminal of transistor 102 can be coupled to the drain terminal of transistor 108 (e.g., p-channel transistor).

Sense capacitor circuit 105 can include sense capacitor 106 and transistor 108. The gate terminal of transistor 108 is coupled to delay path 109. The source terminal of transistor 108 is coupled to a first terminal of sense capacitor 106. A second terminal of sense capacitor 106 can be coupled to ground (gnd). The drain terminal of transistor 108 is coupled to the drain terminal of transistor 102 (or optionally resistor 104) and voltage detection circuit 107. The drain terminals of transistors 102, 108 are coupled to a memory output line (oline), which can be coupled to a memory cell through a y-decoding path (not shown).

Voltage detection circuit 107 can include Schmitt trigger 114 and series inverters 116, 118. The input of the Schmitt trigger 114 is coupled to the memory output line (oline). The output of the Schmitt trigger 114 is coupled to the input of inverter 116. The output of inverter 116 is coupled to the input of inverter 118. The output of inverter 118 is coupled to the gate terminal of transistor 112 (e.g., n-channel transistor).

Delay path 109 can include series inverters 110a-110c and transistor 112. The three series inverters can optionally be replaced with an odd number of inverters. The input of inverter 110a is coupled to the gate terminal of transistor 108 and the gate terminal of transistor 112. The output of inverter 110c is coupled to the source terminal of transistor 112. The drain terminal of transistor 112 is coupled to output latch 120.

Output latch circuit 120 can include inverter 122, NAND gate 126 and resistor 124. The input of inverter 122 is coupled to the drain of transistor 112 and a first terminal of resistor 124. The output of inverter 122 is coupled to a first input of NAND gate 126 and the input of inverter 128. A second terminal of resistor 124 is coupled to the output of NAND gate 126. A second input of NAND gate 126 is a sense amplifier reset input (sa_resetb). The output of inverter 128 is a data output line (dout). In some implementations, resistor 124 is optional and can be omitted. In such a configuration, the output of NAND gate 126 can be directly coupled to the input of inverter 122.

Figure 2:
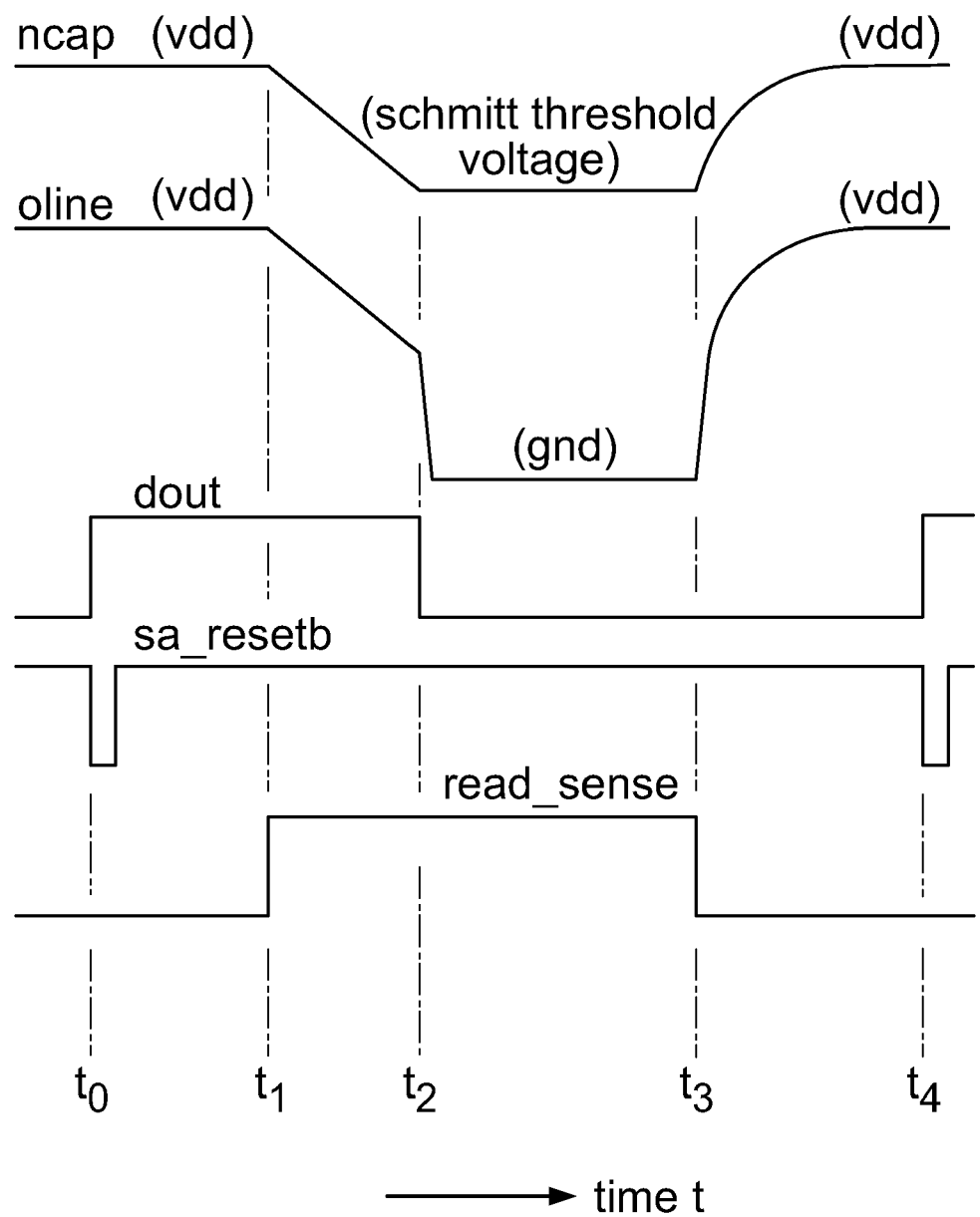
FIG. 2 is a timing diagram illustrating a read "0" memory transaction performed by the low power sense amplifier of FIG. 1.
Figure 3:
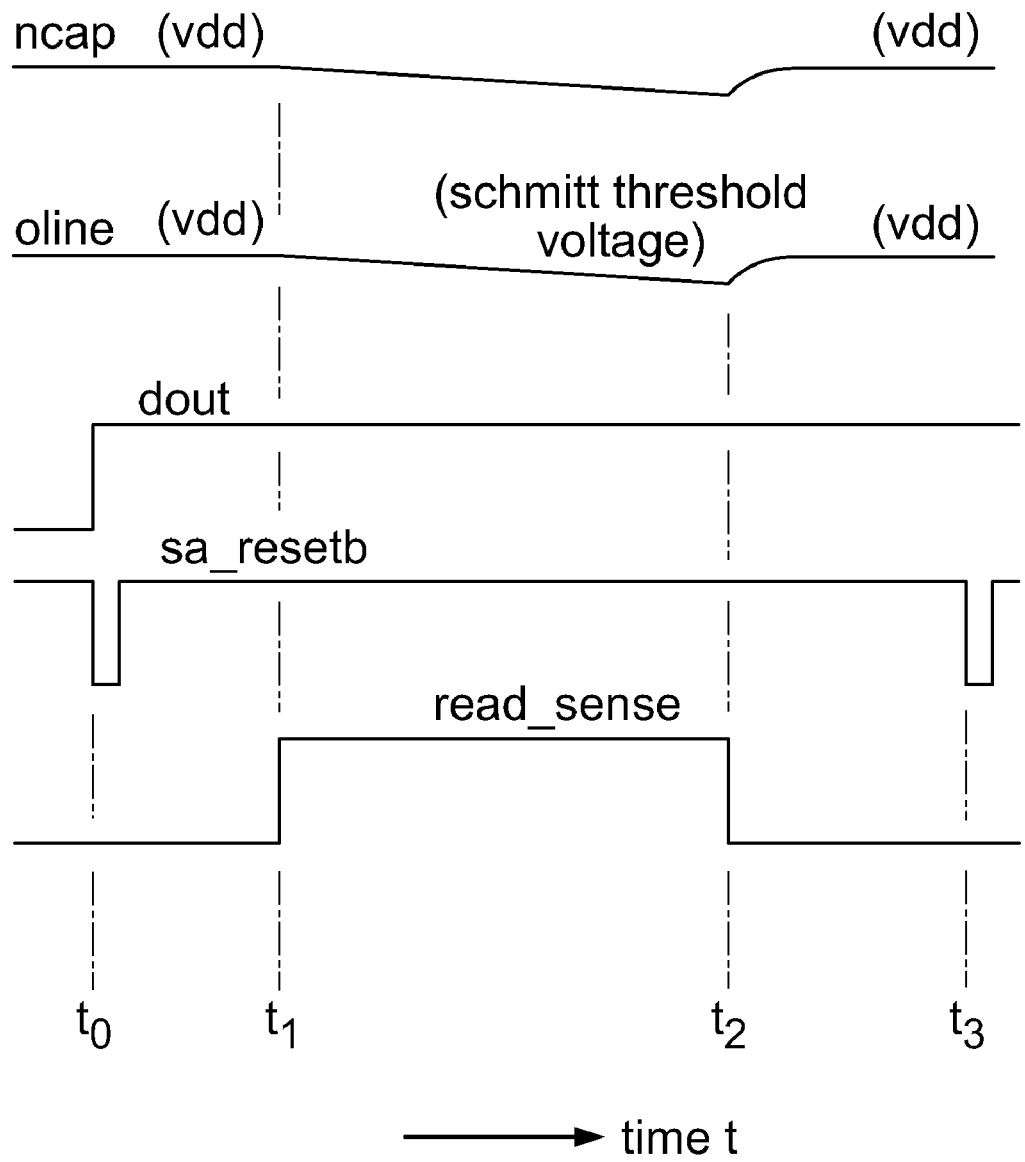
FIG. 3 is a timing diagram illustrating a read "1" memory transaction performed by the low power sense amplifier of FIG. 1.

Having now described an exemplary implementation of low power sense amplifier 100. FIGS. 2 and 3 (with reference to FIG. 1), will now be described to illustrate the operation of sense amplifier 100 during read "0" and read "1" memory transactions.

Exemplary Read "0" Transaction

FIG. 2 is a timing diagram illustrating a read "0" memory transaction performed by the power sense amplifier 100 of FIG. 1. During a pre-charge phase (from time t0 to time t1), read_sense input (a timed signal) is low, causing sense capacitor 106 to be charged slowly to the reference voltage (vdd) using transistor 102 through optional resistor 104. During the pre-charge phase, the voltage on the gate terminal of transistor 108 is low, allowing sense capacitor 106 to be charged to a voltage (ncap) equal to the voltage reference (vdd). While read_sense input is low, sa_resetb input is pulsed low (at time t0) to set the output of NAND gate 126 high, and thus the data output line (dout) is also set high (at time t2) by virtue of series inverters 122, 128.

When read_sense input is high during a sensing phase (e.g., during time t1-t3), the pre-charge path through transistor 102 is cut off. The memory output line (oline) is at the reference voltage (vdd) and its voltage might dip slightly due to charge sharing. The size of sense capacitor 106 can be selected to be significantly larger than the capacitance on the memory output line (oline) to avoid a large dip in voltage due to charge sharing. The voltage (ncap) stored on sense capacitor 106 starts discharging due to the memory cell current. The slope of the voltage on the memory output line (oline) depends on the memory cell current. Once the voltage on the memory output line (oline) voltage reaches a threshold voltage level of Schmitt trigger 114 (at time t2), the output terminal of Schmitt trigger 114 goes high, causing the output of inverter 116 to go low and the voltage on the gate terminal of transistor 108 to go high. The high voltage on the gate terminal of transistor 108 causes transistor 108 to be turned off due to the connection of the gate terminal of transistor 108 to the output of inverter 118. Sense capacitor 106 is disconnected from the memory output line (oline). At this time the memory output line (oline) may continue to discharge (e.g., discharge to ground) due to the memory cell current, as illustrated in FIG. 2, or the discharge may end earlier, depending on the timing of the read. However, the voltage on the sense capacitor 106 remains at the threshold of the voltage detection circuit 107. The sense capacitor 106 does not need to be pre-charged from ground potential, thus resulting in a lower current operation of the circuit.

When the voltage on the gate terminal of transistor 108 is high, the gate terminal of transistor 112 is also high and transistor 112 is open. With transistor 112 open, inverters 110a-110c will invert and delay the voltage on the gate terminal of transistor 108. A low voltage on the source terminal of transistor 112 (output of inverter 110c) overpowers output latch 120 at the output of inverter 122 and pulls the voltage at the input of inverter 122 low. The output of inverter 128 or data output line (dout) will go low as a result (at time t2).

Exemplary Read "1" Transaction

FIG. 3 is a timing diagram illustrating a read "1" memory transaction performed by the low power sense amplifier 100 of FIG. 1. If a memory cell has a higher threshold and negligible cell current, the memory output line (oline) will not discharge enough so as to trip Schmitt trigger 114. The data output line (dout) remains high. The memory output line (oline) is disconnected from the memory cell when the read_sense input goes low (at time t2). This starts a pre-charge of the memory output line (oline) and the voltage on the gate terminal of transistor 108 goes low, thus opening transistor 108. While sense capacitor 106 charges back to the reference voltage (vdd) for the next read, sa_resetb input (a timed signal) is pulsed low (at time t3) to set the data output line (dout) back to high for all sense amplifiers in the circuit, including the sense amplifiers that read a "0."

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A low power sense amplifier, comprising:
an output latch circuit coupled to a data output line and a reset input;
a sense capacitor circuit including a sense capacitor;
a pre-charge circuit having a memory output line coupled to a memory cell, the pre-charge circuit configurable, in a pre-charge phase and in response to a reset signal, to charge the sense capacitor and the memory output line to a reference voltage, and during a sensing phase occurring after the pre-charge phase, allow the voltage on the sense capacitor and on the memory output line to discharge due to current of the memory cell;
a voltage detection circuit coupled to the memory output line, the voltage detection circuit configurable to: detect that the voltage of the capacitor has reached a threshold voltage level; to decouple the sense capacitor from the memory output line; and to allow the voltage on the memory output line to continue to discharge due to the current of the memory cell; and
a delay path coupled to the voltage detection circuit, the delay path configured for inverting and delaying a voltage on an output of the voltage detection circuit, and to cause the output latch circuit to latch a data voltage level on the data output line due to the inverted and delayed voltage.

2. The low power sense amplifier of claim 1, where an input of the output latch circuit is coupled to the output of the voltage detection circuit and an output of the delay path.

3. The low power sense amplifier of claim 2, where the coupling is performed by a first transistor having a source terminal coupled to the output of the delay path, a gate terminal coupled to the output of the voltage detection circuit and a drain terminal coupled to an input of the output latch circuit.

4. The low power sense amplifier of claim 3, where the output latch circuit comprises:
a first inverter coupled to the drain terminal of the first transistor;
a second inverter coupled to an output of the first inverter, where an output of the second inverter is the data output line; and
a NAND gate having an output coupled to the input of the first inverter and having inputs coupled to the output of the first inverter and the reset input.

5. The low power sense amplifier of claim 4, where the delay path comprises:
a number of inverters coupled in series, where an input to a first inverter in the series of inverters is coupled to the gate terminal of the first transistor and to a gate terminal of a second transistor.

6. The low power sense amplifier of claim 5, where a source terminal of the second transistor is coupled to the sense capacitor and a drain terminal of the second transistor is coupled to the memory output line, and the second transistor is configured to isolate the sense capacitor from the memory output line during the sensing phase so energy used to recharge the sense capacitor during a next pre-charge phase is reduced.

7. The low power sense amplifier of claim 6, where the voltage detection circuit comprises:
- a Schmitt trigger coupled in series with two inverters, where an input of the Schmitt trigger is coupled to the memory output line and an output of the Schmitt trigger is coupled to an input of a first inverter of the two series inverters, and where an output of the second inverter of the two series inverters is coupled to the gate terminal of the first transistor.

8. The low power sense amplifier of claim 7, where the pre-charge circuit comprises:
- a third transistor having a source terminal coupled to the voltage reference, a gate terminal coupled to a read sense input, and a drain terminal coupled to the memory output line.

9. The low power sense amplifier of claim 8, where second and third transistors are p-channel transistors and the first transistor is an n-channel transistor.

10. The low power sense amplifier of claim 9, where the drain terminal of the third transistor is coupled to a current limiting resistor.

11. The low power sense amplifier of claim 9, where the output of the NAND gate is coupled to a resistor.

12. The low power sense amplifier of claim 11, where the memory cell is a non-volatile memory cell.

* * * * *